United States Patent [19]
Sowards

[11] Patent Number: 6,131,172
[45] Date of Patent: *Oct. 10, 2000

[54] METHOD FOR CLASSIFYING ELECTRONIC DEVICES

[75] Inventor: Steven R. Sowards, Nampa, Id.

[73] Assignee: Micron Electronics, Inc., Nampa, Id.

[*] Notice: This patent is subject to a terminal disclaimer.

[21] Appl. No.: 09/026,873

[22] Filed: Feb. 20, 1998

[51] Int. Cl.[7] .................................................. G11C 29/00
[52] U.S. Cl. .......................... 714/718; 324/755; 702/117
[58] Field of Search ........................... 714/718; 324/755; 702/117

[56] References Cited

U.S. PATENT DOCUMENTS

| | | | |
|---|---|---|---|
| 3,758,759 | 9/1973 | Boisvert Jr. et al. | 714/718 |
| 3,826,909 | 7/1974 | Ivashin | 714/736 |
| 4,348,759 | 9/1982 | Schnurmann | 714/712 |
| 4,544,882 | 10/1985 | Flora | 714/744 |
| 4,736,373 | 4/1988 | Schmidt | 714/711 |
| 4,768,195 | 8/1988 | Stoner et al. | 714/736 |
| 5,499,248 | 3/1996 | Behrens et al. | 714/724 |
| 5,535,163 | 7/1996 | Matsui | 365/201 |
| 5,650,732 | 7/1997 | Sakai | 324/755 |
| 5,751,728 | 5/1998 | Katanosaka | 714/719 |
| 5,862,147 | 1/1999 | Terauchi | 714/718 |
| 5,898,700 | 4/1999 | Kim | 324/765 |
| 5,917,808 | 6/1999 | Kosbab | 370/254 |

OTHER PUBLICATIONS

U.S. Patent application Ser. No. 09/026,871, filed Feb. 20, 1998, entitled "Device for Classifying Electronic Components".

van de Goor, A.J.; van der Arend, P.C.M.; Tromp, G.J.; "Functional Memory Array Testing" CompuEuro '90. Proceedings of the 1990 IEEE International Conference on Computer Systems and Software Engineering, pp. 408–415, 1990.

Ashtijou, M.; Fusheng Chen; "Functional Testing of RAMs by Random Testing Simulation", Memory Testing, 1993., Records of the 1993 IEEE International Workshop on, pp. 44–48.

*Primary Examiner*—Albert De Cady
*Assistant Examiner*—Guy Lamarre
*Attorney, Agent, or Firm*—Trop, Pruner & Hu, P.C.

[57] ABSTRACT

A method for classifying a device as being a first device type or a second device type, wherein the first and second device types are each contained a package which has a plurality of terminals. The method includes identifying at least one target terminal, testing the target terminal, and classifying the device based upon the testing act.

22 Claims, 3 Drawing Sheets

METHOD FOR CLASSIFYING ELECTRONIC DEVICES

BACKGROUND OF THE INVENTION

1. Field of the Invention

The invention relates generally to testing electronic components and, more specifically, to distinguishing one type of component from another type of component packaged in the same style of package.

2. Description of Related Art

Electronic components, or "chips," generally comprise a small piece of semiconducting material (usually silicon) on which an integrated circuit is embedded. The semiconducting material is packaged within an encapsulation, such as a plastic case, with a plurality of terminals, also referred to as pins, legs or leads, extending from the component case. Different types of chips include microprocessor chips, which contain an entire processing unit, and memory chips, which store data.

Common component package styles include dual in-line packages (DIP), which are the traditional bug-like chips that have anywhere from 8 to over 40 terminals configured to extend through holes in a printed circuit board, evenly divided in two rows. Pin-grid arrays (PGA) are square chips in which the pins are arranged in concentric squares, and single in-line packages (SIP) are chips that have just one row of legs in a straight line like a comb. In addition to these types of chips, there are also single in-line memory modules (SIMM) and dual in-line memory modules (DIMM), which consist of several memory chips packaged as a single unit. Other types of chip package styles include small outline packages (SOP), which include terminals configured for surface mounting, wherein the chip terminals are connected to the surface of a printed circuit board, rather than extending through a hole in the circuit board. Variations on SOPs include shrink small outline packages (SSOP), very small outline packages (VSOP), thin small outline packages (TSOP) and thin shrink small outline packages (TSSOP).

Electronic components, such as memory chips, are customarily manufactured in multiple configurations. For example, a single type of memory chip may include variations which store different amounts of data, or there may be various ways to arrange the data stored within the memory chip. These various configurations, however, may be packaged in identical chip package styles, making the various configurations indistinguishable to one simply looking at the configuration, size or shape of the chip.

In most manufacturing processes, including manufacturing electronic components such as chips, a series of checks and inspections are typically employed to insure that quality standards are met. Often, these quality assurance tests are simply "pass-fail" checks, though this is not necessarily the most practical manufacturing practice. While manufacturers may prefer to only ship products conforming to the highest standards, this is not always economically feasible, since different applications for manufactured items require different quality or reliability levels. Since, the manufacturing cost generally increases as the quality level increases, manufacturers need to use as many products produced as possible.

For example, computer memory devices are manufactured to store a predetermined amount of data. Computer random access memory (RAM), or main memory, can be thought as an array of boxes, each of which can hold a single byte of information. A memory device that stores one megabyte (meg) of memory, therefore, can hold about one million bytes (or characters) of information. There are several types of computer memory devices, including static RAM (SRAM), dynamic RAM (DRAM) and synchronous DRAM (SDRAM). Thus, a 16 meg DRAM is supposed to hold approximately 16 megs of data.

If, during quality assurance testing, a 16 meg DRAM is found to have some defective arrays, such that the 16 meg DRAM only is capable of storing 15 megs of data, it typically would fail the quality assurance test and be scrapped. A scrapped DRAM may also be referred to as a "partial" or a "partial DRAM". If components such as the partial DRAMs are retested and the bad arrays are identified, there are many applications which can use these partials, preventing waste and reducing manufacturing costs. Some manufacturers have implemented "component recovery" programs to make use of subperforming components such as these partial DRAM chips. Other companies specialize in component recovery, buying products which may have been rejected during the initial manufacturing process then sorting, retesting, and grading the products for use in their own products where appropriate, or reselling them for use in suitable applications.

A significant problem with current component recovery programs occurs when the component fails the original quality assurance test, and the initial manufacturing process for the failing component halts. Because the process halts, these parts are not marked to identify the component type on the component package. Many different types or configurations of electronic components may be contained in packages that look identical. Absent an indication of the component type on the package, it is impossible to identify the component visually. Moreover, even if the components are marked, a component recovery company that purchases graded components or partials may demark the component so that it may be remarked with the recovery company's identifier. This demarking process must occur prior to component testing to insure that the demarking process did not damage the component.

Thus, a need exists for a system and method for distinguishing one component type from another component type that is contained in the same package style.

SUMMARY OF THE INVENTION

In one aspect of the invention, a method for classifying a device as being a first device type or a second device type is presented. The first and second device types are each contained in a package which has a plurality of terminals. The method includes identifying at least one target terminal, testing the target terminal, and classifying the device based upon the testing act.

BRIEF DESCRIPTION OF THE DRAWINGS

Other objects and advantages of the invention will become apparent upon reading the following detailed description and upon reference to the drawings in which.

Figure 1:
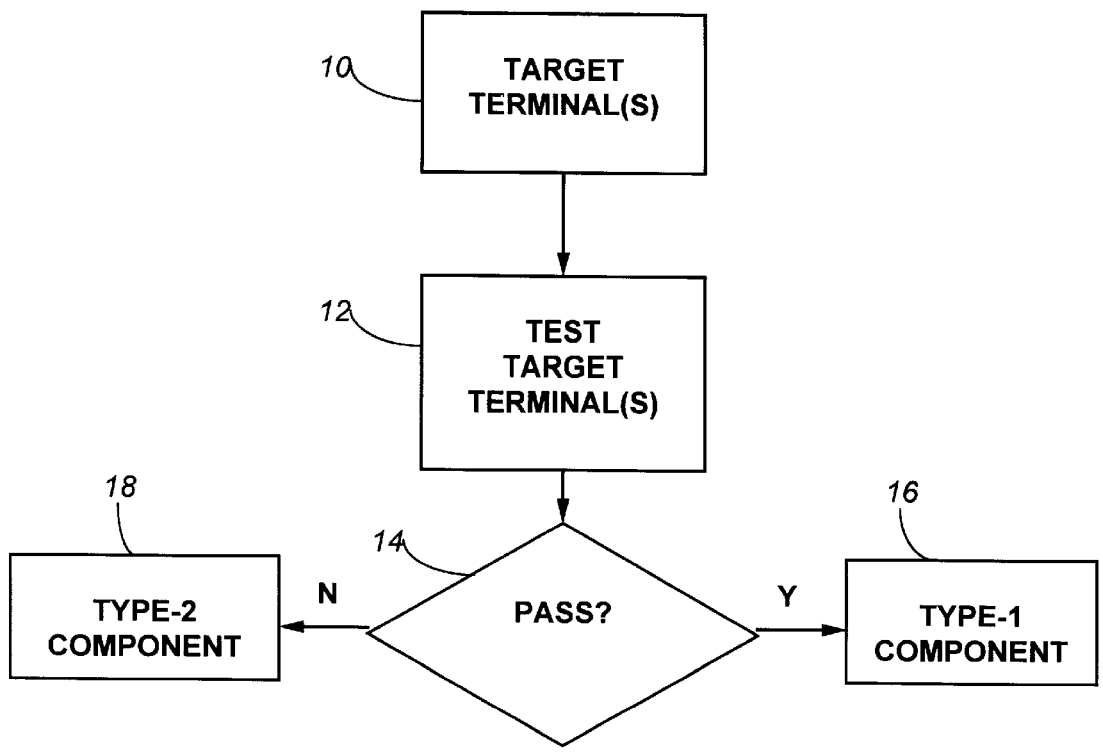
FIG. 1 is a flow diagram illustrating steps for classifying components in accordance with an embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Method of the First Embodiment

FIG. 1 illustrates a flow diagram of one particular embodiment a method in accordance with the invention for classifying an electronic device as a first device type or a second device type, wherein both device types are packaged in the same style of package. Various package styles are described in the Background of the Invention section herein. Often, different types of components or component variations packaged in the same chip package style use the component terminals, or pins, for different purposes. Sometimes, terminals used for one component variation are unused with another component variation. In block 10 of FIG. 1, selected terminals are identified, or "targeted." For example, terminals that are used in a first device type but not used in a second device type may be targeted. Alternately, terminals that are used by a first component for one purpose but which are used for a different purpose in a second component may be targeted.

A test is performed on the target terminals in block 12 of FIG. 1. The test performed in block 12 determines, for example, the function of the target terminal or whether the target terminals are used by the component. In decision block 14, it is determined whether the component passed the test. Components that pass the test of block 12 are identified as components of the first type, or "type-1" components in block 16, and those that fail are identified as components of the second type, or "type-2" components in block 18.

In one particular embodiment of the invention, the test performed in block 12 is a continuity test on the targeted terminals to determine whether the targeted terminals are coupled to the component or unused by the component. The present invention, however, is not limited to any particular test on the targeted terminals. The present invention encompasses any test that the user chooses to use to distinguish the components. Moreover, these tests are not disclosed in detail herein as the design of such tests is within the skill of the art.

Component Tester

Figure 2:
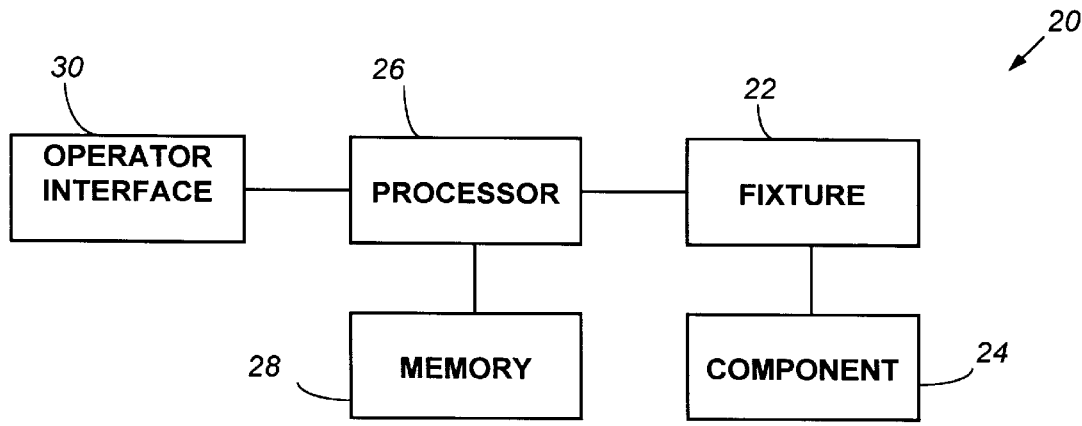
FIG. 2 illustrates a simplified block diagram of a component tester in accordance with an embodiment of the present invention.

In FIG. 2, a simplified block diagram of a component tester 20 suitable for an embodiment of the present invention is illustrated. Examples of component testers which may be used with the present invention include a Genesis II or a Teradyne model J994, both available from Teradyne, Inc. The Genesis II tester is a personal computer (PC) based tester which can test up to 32 devices in parallel. The Teradyne J994 tester is a SUN® workstation based tester which allows up to 64 devices to be tested in parallel.

Each tester 20 includes, in general, a fixture 22 which electrically couples the terminals of at least one component 24 to be tested to the tester 20, a processor 26 and a memory storage device 28 which contains the instructions for testing the component 24 in accordance with the invention. The processor 26 may be any conventional general purpose single- or multi-chip microprocessor such as a Pentium® processor, a Pentium® Pro processor, a 8051 processor, a MIPS® processor, a Power PC® processor, or an ALPHA® processor. Moreover, the processor 26 may be an integral component of a personal computer or mini computer, for example, which is an element of the component tester 20. The memory device 28 may be any conventional computer storage device readable by the processor 26, such as a computer hard drive, a compact disk, magnetic tape, or a floppy diskette, and also may be an element of a computer associated with the tester 20. The component tester 20 further includes an operator interface 30, which, for example, may include a standard computer video display, a keyboard and a pointing device such as a mouse or trackball.

Method of the Second Embodiment

Figure 3:
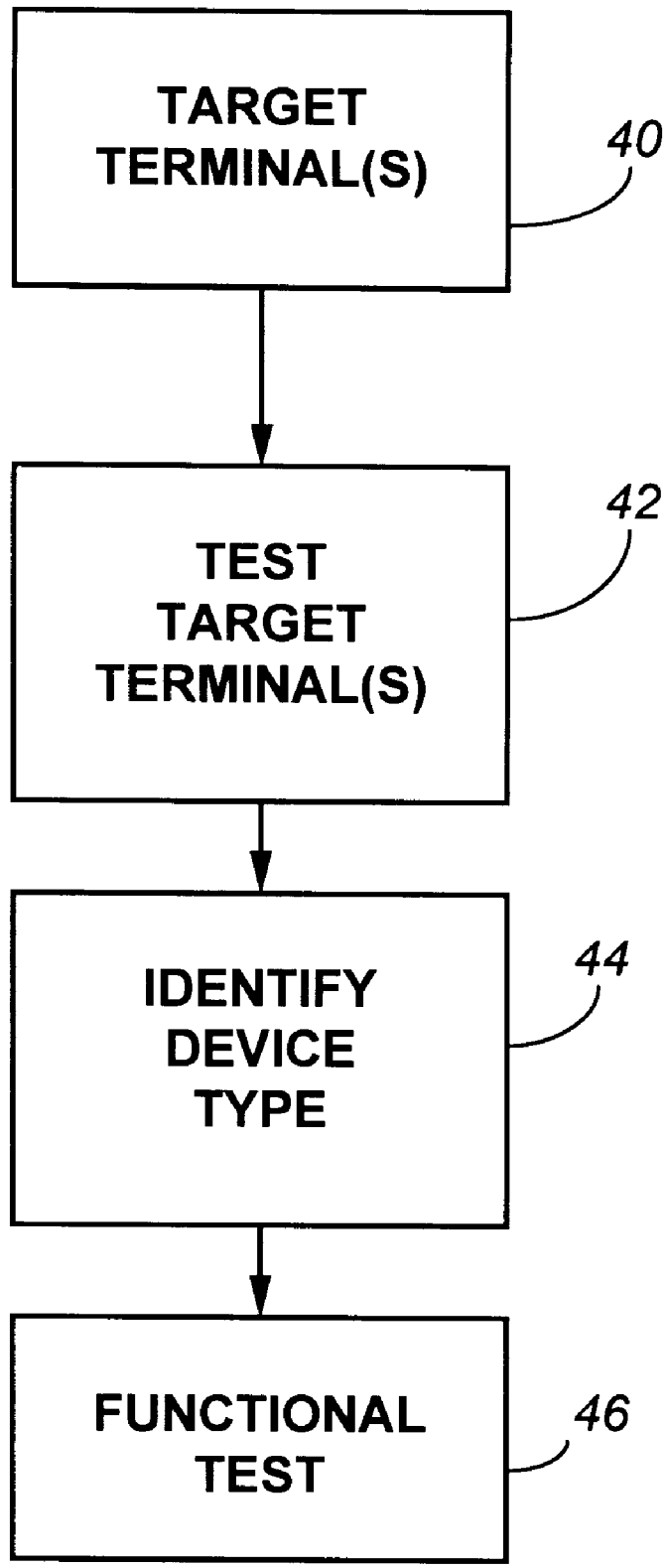
FIG. 3 is a flow diagram illustrating an alternate embodiment of a method for classifying components in accordance with an embodiment of the present invention.

An alternate embodiment of the invention is illustrated in FIG. 3. Target terminals are identified in block 40, then a first test is performed on the target terminals in block 42 to determine, for example, the function of the target terminal or whether the target terminals are used by the component. The test performed in block 42 is not limited to any particular type of test; any suitable test as is known in the art may be used. The component is initially identified as a type-1 or type-2 component in block 44. Following the initial component identification in block 44, a second test is performed in block 46 on the chips to verify the results of the first test of block 42.

In one particular embodiment, components which pass the first component test 42 and are identified as type-1 components in block 44 are additionally tested by performing a functional test on these components that determines whether the components are properly performing the function of a type-1 component. In other words, a test that a properly functioning type-1 component would pass, but a properly functioning type-2 component would fail may be used in block 46. The design of such tests are within the skill of the art. Thus, passing the functional test 46 after being initially identified as a type-1 component gives further assurances that the component has been properly identified as a type-1 component.

Method of the Third Embodiment

One particular embodiment in accordance with the present invention distinguishes different configurations of SDRAM chips. An SDRAM is designed to operate in a synchronous memory system. Thus, all operations in the SDRAM are synchronized to a clock signal. A memory array is divided into two or more banks for storing data, with each bank memory array including storage cells organized in rows and columns. A typical arrangement of a 16 meg SDRAM chip includes two bank memory arrays, each comprising four separate arrays of 2048 rows×1024 columns. This arrangement is referred to as a "4 meg×4" SDRAM. The 4 meg×4 SDRAM chip further includes four input/outputs, or "DQs," each coupled to a terminal of the component package, thus, the 4 meg×4 SDRAM chip includes four DQ terminals. An alternate 16 meg SDRAM arrangement is the 2 meg×8, which also includes two bank memory arrays. Each of the memory arrays in the 2 meg×8 includes eight separate arrays of 2048 rows×512 columns, with eight DQs. Therefore, the 2 meg×8 SDRAM chip has eight DQ terminals. Examples of the 4 meg×4 and 2 meg×8 SDRAMs include Micron Technology, Inc. part numbers MT48LC4M4A1 S and MT48LC2M8A1 S, respectively.

The exemplary 2 meg×8 and 4 meg×4 SDRAM configurations mentioned above are packaged in the same package style: 44-pin thin shrink small outline packages (TSOPs). In other words, the 2 meg×8 and the 4 meg×4 SDRAM components as packaged are indistinguishable from each other absent some labeling on the package case. In component recovery processes, component manufacture is often interrupted prior to marking the component, or the component is demarked prior to testing, as discussed is above. One embodiment of the present invention distinguishes one unmarked SDRAM configuration from the other.

The TSOP package includes a main body and 44 terminals, or pins, electrically coupled to various functional portions of the component, with the terminals extending from the main body. Often, chips do not use all of the terminals extending from the package body, as is the situation with the SDRAM components described above, which do not use all 44 terminals. The unused terminals are simply not connected to the circuit, or in other applications, they may be coupled to ground.

As discussed above, the 2 meg×8 SDRAM configuration includes eight DQs, and the 4 meg×4 configuration includes four DQs. The 2 meg×8 configuration's eight input/outputs, DQ0–DQ7, are on terminals 2, 4, 6, 8, 37, 39, 41 and 43 of the package, respectively. In comparison, the 4 meg×4 SDRAM has four input/outputs, DQ0–D3, on terminals 4, 8, 37 and 41, respectively. Terminals 2, 6, 39 and 43 of the 4 meg×4 configuration SDRAM are not connected to the circuit. Thus, in the first device (the 2 meg×8 SDRAM configuration), four terminals (2, 6, 39 and 43) are connected to input/outputs, while these same four terminals are unused in the second device (the 4 meg×4 SDRAM configuration).

The component tester 20 in accordance with an embodiment of the present invention includes a processor 26 and a memory storage device 28 which may be integral to a personal computer or other type of computer. To distinguish the 2 meg×8 SDRAM chips (type-2 component) from the 4 meg×4 SDRAM chips (type-1 component), the components 24 (in FIG. 2) to be identified are coupled to the tester's fixture 22. Instructions are stored in the memory storage device 28 that when executed by the processor 26 cause the tester 20 to perform a continuity check, as is known in the art, on the component 24 terminals which are coupled to DQs present in the 2 meg×8 chip but not present in the 4 meg×4 SDRAM chip. Thus, terminals 2, 6, 39 and 43 of the 44-pin TSOP package, corresponding to DQs 0, 2, 5 and 7 of the 2 meg×8 SDRAM chip, are targeted for being tested. If the continuity check on all of these terminals fails, the chip is identified as the 4 meg×4 component (type-1).

In an exemplary embodiment of the invention, the continuity check performed by the tester 20 includes: 1) applying a constant current to the ground (Vss) pin; 2) measuring the voltage across each pin with reference to ground; and 3) any voltage between 0v and −2v constitutes passing. The above actions are for conventional current flow (current flows from positive to negative). For negative current flow (current flows from negative to positive) the polarities of the voltage are reversed.

Figure 4:
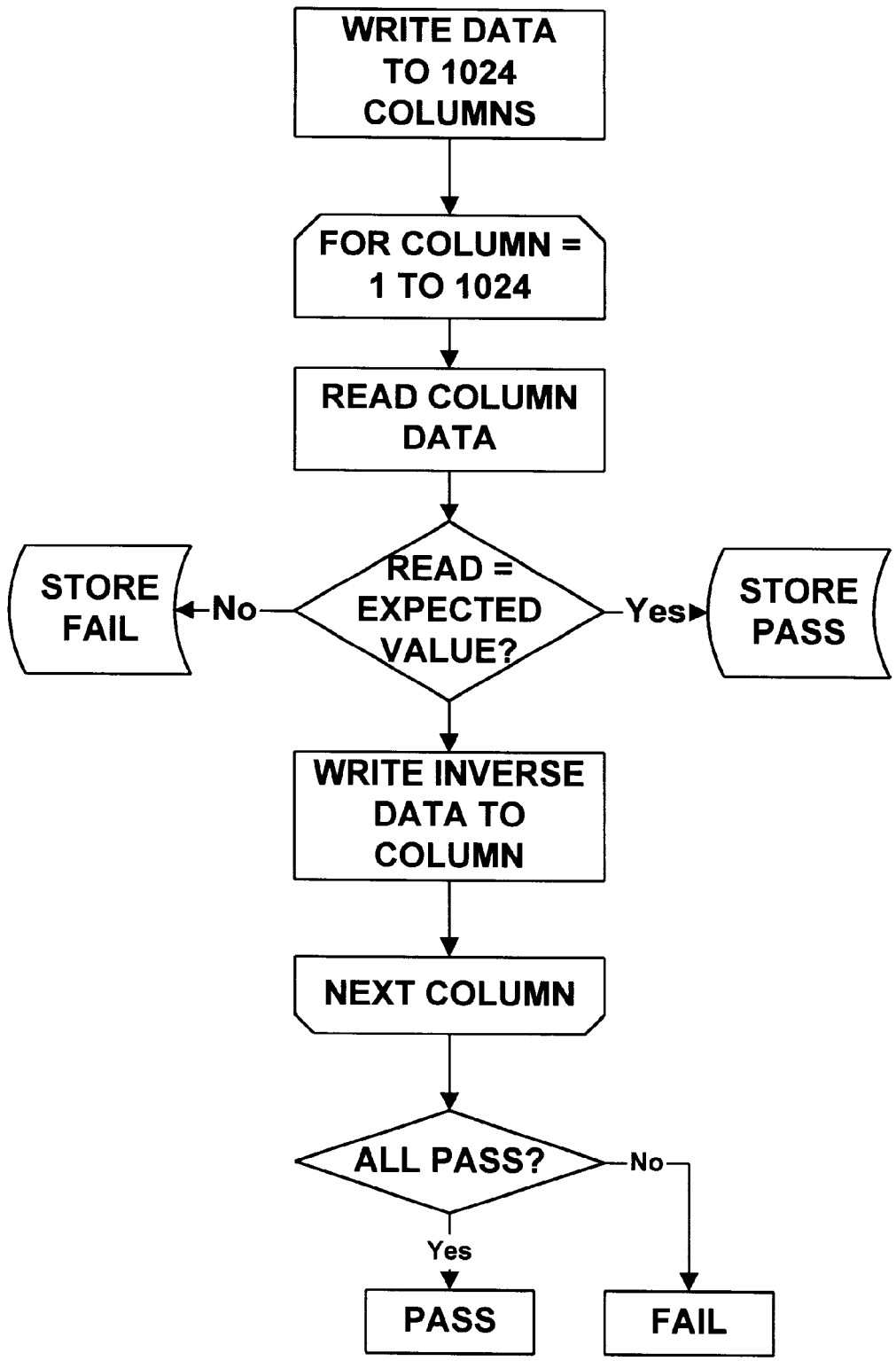
FIG. 4 is a flow diagram illustrating a functional component test in accordance with an embodiment of the invention.

Additionally, the tester's processor 26 may be programmed to perform subsequent tests on the components 24. In an exemplary embodiment of the invention, a functional test is performed on components 24 failing the continuity check. An example of a functional test used in the process of distinguishing the 4 meg×4 from the 2 meg×8 SDRAM is known as a "read—modified write" test. Read—modified write tests are well known in the art. FIG. 4 illustrates an example of a read—modified write test. The test comprises writing data of a given logic level to 1024 columns of a single row of one bank, but not both banks, of components initially identified as 4 meg×4 SDRAMs in block 60. A loop begins in block 62, in which the data are read from each column in block 64, and compared to the expected value in block 66. If the value read in block 64 matches the expected value, the column is then over-written with data of a logic level inverse to the data read in block 68, and the test continues with the next column in block 70. If the value read (block 64) matches the expected value in each column, the test passes in block 72. If the value read in block 64 does not match the expected value, the test fails in block 74.

More specifically, in a 4 meg×4 SDRAM, which has 1024 columns in each memory array, data of the given logic level, for example, logic 1, will be written to each column in the row in block 60. The data from each column, one at a time, is read in block 64, and the value read is compared to the expected value in block 66. If the value read in block 64 matches the expected value in decision block 66, the value read is over-written with inverse data in block 68 and the test continues in block 70. If the row being tested loops back on itself (because the number of columns is less than expected), the expected data and the read data will be different in block 64, resulting in a fail (block 74). If the number of columns is the same as expected, the data read in block 62 will match the expected data in block 66 and the test will pass in block 72, confirming the 4 meg×4 identification.

A 2 meg×8 SDRAM, which only has 512 columns in each memory array, will fail this functional test. For example, in the functional test described above, logic 1's are written to 1024 columns of a single row in the 2 meg×8 SDRAM chip in block 60. Since the memory array of the 2 meg×8 chip only has 512 columns, 512 logic 1's will be written, then another 512 logic 1's will be written to the same 512 columns (data are written to only one row). The logic 1 written to each of the first 512 columns is read in block 64, then over-written with a logic 0 in block 68, since the logic 1 was expected in block 66. Now, all 512 columns contain a logic 0. When the test continues with column number 513 in block 70, the row will actually loop back on itself, returning to column 1. The original logic 1 in column number 1 was over-written with a logic 0 in block 68 of the column number 1 portion of the test. Thus, the test will read the logic 0 in block 64, which does not match the expected logic 1 in decision block 66. Hence, the functional test fails, and the part is identified as a 2 meg×8 SDRAM.

The process for distinguishing disclosed herein may also be applied to other types of memory devices, such as conventional DRAM chips. For example, the invention could be embodied to distinguish 16 meg×4 DRAM chips from 8 meg×8 DRAM chips. As with the SDRAM chips, the component DQ connections may be used to distinguish the different memory configurations. Examples of these DRAM chips include Micron Technology, Inc. part numbers MT4LC16M4G3 and MT4LC16M4H9 (16 meg×4) and MT4LC8M8P4 and MT4LC8M8C2 (8 meg×8). These DRAM configurations are packaged in 32-pin packages, with the 8 meg×8 configuration having eight input/outputs, DQ1–DQ8, coupled to terminals 2, 3, 4, 5, 28, 29, 30 and 31 of the package, respectively. The 16 meg×4 configuration has 4 input/outputs, DQ1–DQ4, coupled to terminals 2, 3, 30, and 31 of the package, respectively. Thus, pins 4, 5, 28, and 29 of the 16 meg×4 package may be targeted for a continuity test or other test to determine whether the terminal is used by the component.

The processor 26 could further be programmed to subsequently perform a suitable functional test on these components. The read—modified write test could be modified and applied to memory device configurations which have bank memories arranged in rows and columns, wherein the devices have different numbers of columns. To perform the test, the number of columns included in the memory configuration having the greater number of columns must be identified. Next, data of a given logic level are written to a number of columns of a single row equal to this number of columns, followed by a read—modified write to the same number of columns. A component having fewer columns will fail this test. Other functional tests suitable for the components being distinguished may also be used.

By way of example, the embodiments of the invention disclosed thus far have applied to specific memory devices. One skilled in the art with the benefit of this specification, however, could apply the invention to other types of components. The present invention may be embodied to identify virtually any device as being one type or another type packaged in the same, or similar package styles, wherein one of the device types uses at least one terminal that is unused by the other device type. Once the target terminal is identified, the processor 26 may be programmed to perform an appropriate test, such as a continuity check, to determine whether the terminal is used (connected) in the component 24 being tested. If the terminal is not being used (is unconnected), it is identified as the second component. Subsequently, a functional test may be performed to the verify this identification.

The above description of exemplary embodiments of the invention are made by way of example and not for purposes of limitation. Many variations may be made to the embodiments and methods disclosed herein without departing from the scope and spirit of the present invention. The present invention is intended to be limited only by the scope and spirit of the following claims.

What is claimed is:

1. A method for classifying an electronic device as being a first device type or a second device type, the device types each being contained in a package having the same number of terminals, the method comprising the acts of:

identifying at least one target terminal which is used by the second device type and unused by the first device type;

testing the at least one target terminal; and designating the device type based upon the results of the testing act.

2. The method of claim 1 further comprising the act of functionally testing the device.

3. The method of claim 2 further comprising the functional test act following the testing the target terminal act.

4. The method of claim 2, further comprising the act of functionally testing the device if the at least one terminal is not being used by the device.

5. The method of claim 2 wherein the functional test comprises a test which a properly functioning device of the first device type will pass but which a properly functioning device of the second device type will fail.

6. A method for classifying a component as a first type memory device having at least one input/output or a second type of memory device having a greater number of input/outputs, both types of memory devices being contained in packages having the same package style, the first and second type memory devices including the same member of terminals, the method comprising;

identifying at least one terminal coupled to at least one input/output which is present in the second type of memory device but not present in the first type of memory device; and checking continuity on the at least one terminal.

7. The method of claim 6 further comprising the act of performing a functional test on the component following the continuity check.

8. The method of claim 7 wherein the functional test is performed on components failing the continuity check.

9. The method of claim 7 wherein each of the memory device types includes a pair of bank memory arrays each having storage cells organized in rows and columns, each bank of one memory device type having a different number of columns than the corresponding bank of the other memory device type, the functional test comprising the acts of:

(a) writing data of a given logic level to a number of columns in one row of one bank, the number of columns being equal to the number of columns in the bank having the greater number of columns;

(b) reading the data written in each of the columns;

(c) comparing the data read to the given logic level; and (d) over-writing the data read in act (b) with data of an inverse logic level to the data read in response to act (c).

10. The method of claim 9 further comprising, prior to act (a), the act of determining the number of columns which exist in each bank of the memory device having the greater number of columns.

11. A method for classifying a component as a first type memory device having at least one input/output or a second type of memory device having a greater number of input/outputs, both types of memory devices being contained in packages having the same package style, the first and second memory devices including the same number of terminals, the method comprising:

identifying at least one terminal coupled to at least one input/output which is present in the second memory device type but not present in the first memory device type; checking continuity on the at least one terminal performing a functional test which a properly functioning component of the first memory device type will pass but which a properly functioning component of the second memory device type will fail.

12. A method for distinguishing SDRAM components in a 4 meg×4 configuration from SDRAM components in a 2 meg×8 configuration, both SDRAM configurations being packaged in the same package style, the package including a plurality of terminals, the method comprising the act of checking continuity on the package terminals coupled to input/outputs which are present in the 2 meg×8 configuration but not present in the 4 meg×4 configuration.

13. The method of claim 12 wherein the package includes a ground terminal, and wherein the act of checking continuity comprises the acts of:

applying a constant current to the ground terminal; and measuring the voltage across each of the package terminals coupled to input/outputs which are present in the 2 meg×8 configuration but not present in the 4 meg×4 configuration with reference to ground.

14. The method of claim 12 further comprising the act of performing a functional test on the components following the continuity check.

15. The method of claim 14 wherein the functional test comprises a test which a properly functioning 4 meg×4 SDRAM will pass but a properly functioning 2 meg×8 SDRAM will fail.

16. The method of claim 15 wherein each SDRAM includes a pair of bank memory arrays each having storage cells organized in rows and columns, the performing a functional test act comprising the acts of:

writing data of a given logic level to 1024 columns of one row of one bank;

reading the data written in each of the columns;

comparing the data read to the given logic level; and over-writing the data read with data of an inverse logic level to the data read in response to the comparing act.

17. The method of claim 14 wherein the functional test is performed on components failing the continuity check.

18. A method for classifying an electronic device as being a first device type or a second device type, the device types each being contained in a package having the same number of terminals, the method comprising:

identifying at least one target terminal;

testing the at least one target terminal;

designating the device type based upon the results of the testing act; and functionally testing the device, wherein the functional test comprises a test which a properly functioning device of the first device type will pass but which a properly functioning device of the second device type will fail.

19. The method of claim 18, wherein the identifying act comprises identifying at least one terminal which is used for a given purpose by the first device type and used for a different purpose by the second device type.

20. The method of claim 19 wherein the testing act comprises determining whether the terminal is used for the given purpose.

21. The method of claim 20 wherein the testing act comprises determining whether the at least one terminal is being used by the device to be identified.

22. The method of claim 22, wherein the identifying act comprises identifying at least one terminal which is used by the second device type and unused by the first device type.

* * * * *

UNITED STATES PATENT AND TRADEMARK OFFICE
CERTIFICATE OF CORRECTION

PATENT NO. : 6,131,172
DATED : October 10, 2000
INVENTOR(S) : Steven R. Sowards

It is certified that error appears in the above-identified patent and that said Letters Patent are hereby corrected as shown below:

In claim 6, line 6, replace "member" with --number--.
In claim 22, line 21, replace "claim 22" with --claim 18--.

Signed and Sealed this

Eighth Day of May, 2001

Attest:

NICHOLAS P. GODICI

Attesting Officer     Acting Director of the United States Patent and Trademark Office